(12) United States Patent
Kluge

(10) Patent No.: US 11,579,228 B2
(45) Date of Patent: Feb. 14, 2023

(54) METHOD FOR PROVIDING A PROPOSAL FOR SETTING SCAN PARAMETERS AND A COMPUTING UNIT FOR PROVIDING A SETTING AID

(71) Applicant: Siemens Healthcare GmbH, Erlangen (DE)

(72) Inventor: Thomas Kluge, Hirschaid (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/482,958

(22) Filed: Sep. 23, 2021

(65) Prior Publication Data

US 2022/0099774 A1 Mar. 31, 2022

(30) Foreign Application Priority Data

Sep. 25, 2020 (DE) .......................... 102020212107.9

(51) Int. Cl.
*G01R 33/54* (2006.01)
*G01R 33/58* (2006.01)
*G01R 33/56* (2006.01)

(52) U.S. Cl.
CPC ....... *G01R 33/546* (2013.01); *G01R 33/5608* (2013.01); *G01R 33/58* (2013.01)

(58) Field of Classification Search
None
See application file for complete search history.

(56) References Cited

U.S. PATENT DOCUMENTS

| 6,687,527 B1* | 2/2004 | Wu ...................... G01R 33/546 |
| | | 324/318 |
| 7,051,286 B1 | 5/2006 | Stemmer et al. |
| 11,372,066 B2* | 6/2022 | Koch ................. G01R 33/5608 |
| 2017/0364252 A1 | 12/2017 | Deshpande et al. |
| 2018/0143279 A1 | 5/2018 | Kluge |
| 2020/0203002 A1* | 6/2020 | Amthor .................. G16H 50/20 |
| 2021/0153827 A1* | 5/2021 | Lewis ..................... A61B 6/501 |
| 2022/0099774 A1* | 3/2022 | Kluge .................... G01R 33/58 |

FOREIGN PATENT DOCUMENTS

DE 102016222785 A1 5/2018

OTHER PUBLICATIONS

Google translation of German Office Action for Application No. 10 2020 212 107.9, dated Oct. 5, 2020 (Year: 2020).*
German Office Action for Application No. 10 2020 212 107.9 dated Oct. 5, 2020.

* cited by examiner

*Primary Examiner* — Rodney E Fuller
(74) *Attorney, Agent, or Firm* — Banner & Witcoff Ltd.

(57) ABSTRACT

A proposal is provided for setting scan parameters comprising at least one value range scan parameter and at least two state scan parameters of a scan sequence of a magnetic resonance protocol for a magnetic resonance examination. A user is supported in the selection of the state scan parameters to be set by a computing unit that checks whether the selection of state scan parameters to be set made by the user comprises a permissible combination of settings and/or states. If an impermissible combination of settings and/or states is present, the computing unit ascertains at least one proposal with a permissible combination of settings and/or states for the state scan parameters to be set.

17 Claims, 2 Drawing Sheets

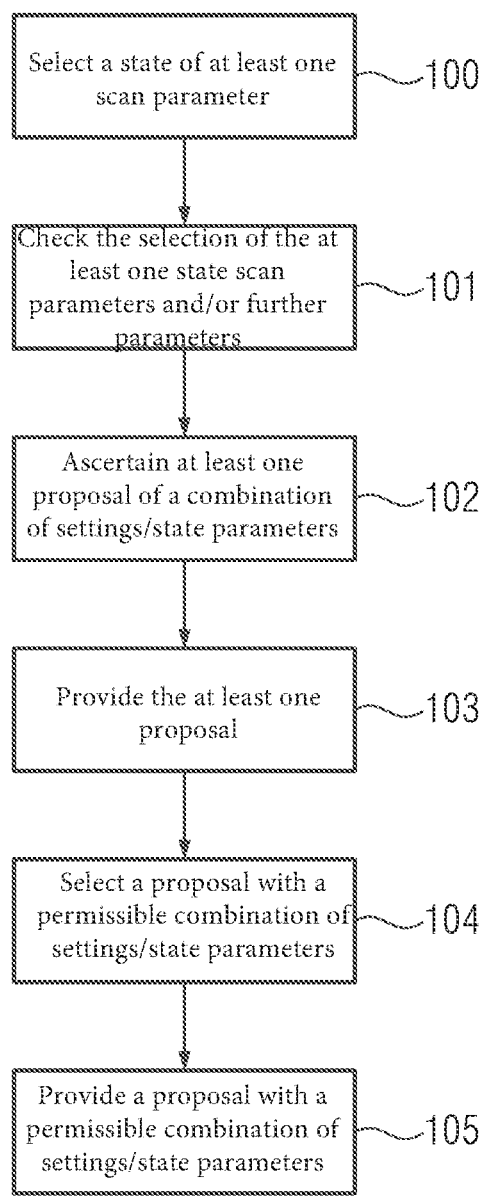

Figure 1:
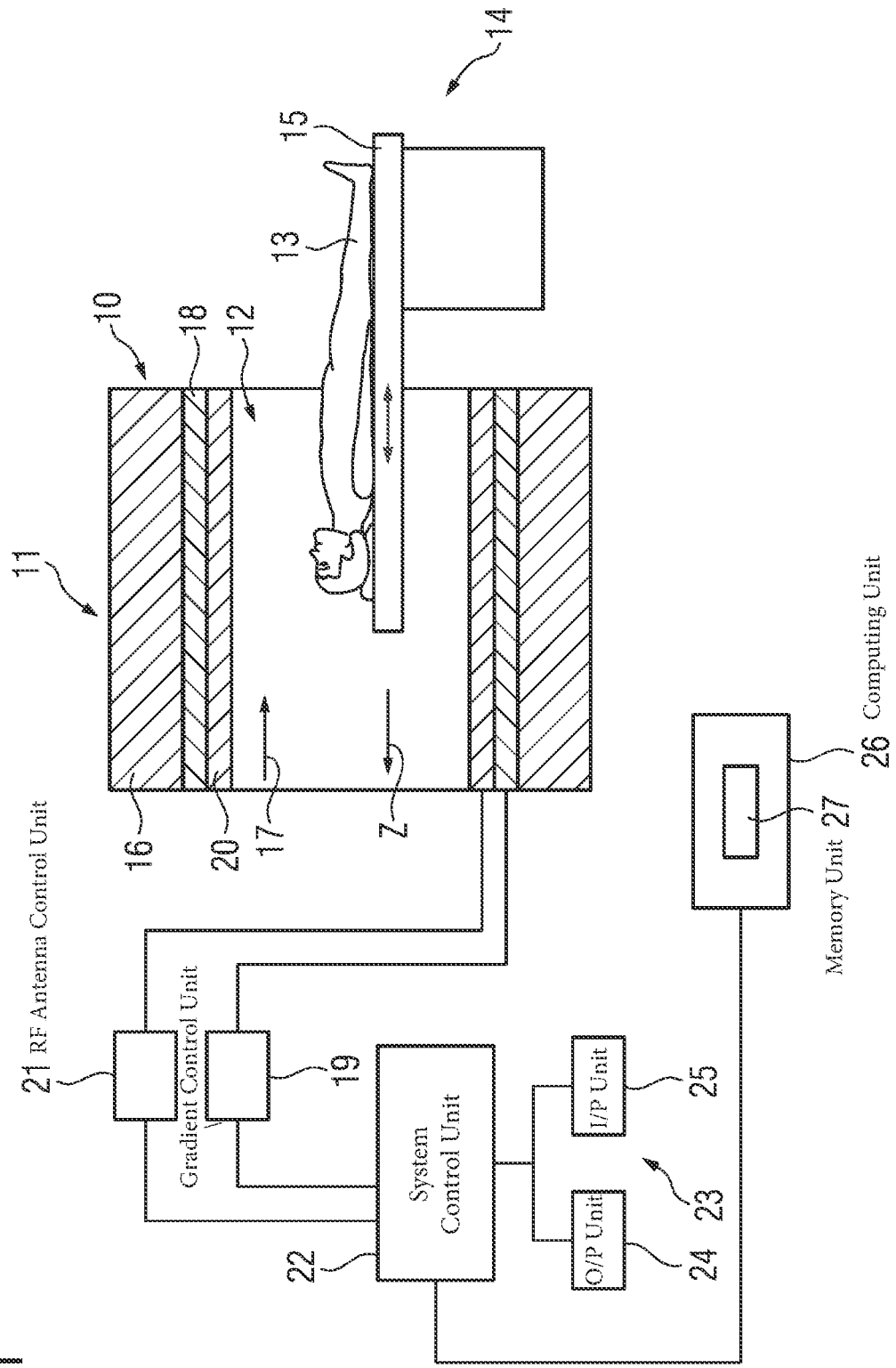

METHOD FOR PROVIDING A PROPOSAL FOR SETTING SCAN PARAMETERS AND A COMPUTING UNIT FOR PROVIDING A SETTING AID

CROSS-REFERENCE TO RELATED APPLICATIONS

The present application claims the benefit of the filing date of Germany patent application no. DE 10 2020 212 107.9, filed on Sep. 25, 2020, the contents of which are incorporated herein by reference in their entirety.

TECHNICAL FIELD

The disclosure relates to techniques for providing a proposal for setting scan parameters comprising at least one value range scan parameter and at least one state scan parameter of a scan sequence of a magnetic resonance protocol for a magnetic resonance examination. Furthermore, the disclosure is related to a computing unit, magnetic resonance apparatus, and corresponding computer program product for executing the method for providing a proposal for setting scan parameters.

BACKGROUND

For setting scan parameters for a scan sequence of a magnetic resonance protocol, a user can select a large number of settings, with the individual scan parameters being at least partially dependent on one another. However, the dependencies between the individual scan parameters are not always simple and comprehensible for the user, but are rather very complex. In addition, if state scan parameters, i.e., scan parameters comprising two or more states are changed, this generally has the result that a very large number of further state scan parameters have to be changed to restore an authorized and/or permissible combination of settings and/or states in the state scan parameters, with which a reliable magnetic resonance examination can then be performed.

To date, when setting the scan parameters, it is displayed to the user whether the selected settings for the scan parameters comprise an authorized and/or permissible combination of settings in the scan parameters, or whether the selected settings for the scan parameters comprise an unauthorized and/or impermissible combination of settings in the scan parameters with which a magnetic resonance scan is not possible. If there is an unauthorized combination in the settings and/or states of the scan parameters, e.g. the state scan parameters, to date it has been provided that the user is provided with a proposal (e.g. an option), wherein the proposal comprises an executable combination. However, it is not evident to the user which scan parameters have been changed or whether the proposal comprises advisable settings for clarifying the current medical issues.

SUMMARY

The present disclosure is directed to supporting a user in the selection of settings of scan parameters (otherwise referred to herein as scan parameter settings). The object is achieved by the features of the embodiments as described throughout the disclosure, including the claims.

The disclosure is based on a method for providing a proposal for setting scan parameters comprising at least one value range scan parameter and at least two state scan parameters of a scan sequence of a magnetic resonance protocol for a magnetic resonance examination, wherein the method comprises the following steps:

selection of a state of at least one state scan parameter by a user, checking of the selection of the at least one state scan parameter with settings and/or states of the further state scan parameters via a computing unit as to whether the selection of the at least one state scan parameter with the settings and/or states of the further state scan parameters comprises a permissible combination of the selected settings and/or states of the state scan parameters to be set, in the event that the selection of the at least one state scan parameter with the settings and/or states of the further state scan parameters comprises an impermissible combination of the selected settings and/or states of the state scan parameters, ascertaining via the computing unit of at least one proposal comprising a permissible combination of the settings and/or states of the state scan parameters to be set, and provision of the at least one proposal.

A magnetic resonance examination on a patient, e.g. an area of the patient to be examined, is intended to clarify a clinical and/or medical issue. Here, a flow chart of a magnetic resonance examination e.g. describes a workflow, wherein the flow chart and/or workflow may define a sequence of the individual protocols one after the other during the performance of the magnetic resonance examination. The flow chart and/or workflow may e.g. define a procedure for the upcoming and/or planned magnetic resonance examination, the selection of an examination strategy that defines the flow chart and/or the workflow for the upcoming and/or planned magnetic resonance examination, and/or for clarifying the clinical and/or medical issue. For example, the definition of the examination strategy can define a contrast to be scanned via the protocols, such as for example a T1 contrast and/or a T2 contrast and/or a diffusion, etc. In addition, the definition of the examination strategy may also define an orientation to be scanned, such as, for example, a sagittal orientation and/or a coronal orientation and/or a transverse orientation and/or a tilted orientation, etc. For a magnetic resonance examination, the flow chart and/or workflow is executed with the selected protocols to obtain medical image data for identifying clinical and/or medical issues.

A magnetic resonance protocol comprises a set of values required to describe a specific expression of a scan sequence. Here, typical values may include an echo time (TE), a repetition time (TR), a field of view, a number of slices, a fat saturation method, an acceleration method, a local radio-frequency antenna unit, etc. Such values of a magnetic resonance protocol are also often heavily dependent on the hardware available on site and/or the implementation of the magnetic resonance apparatus, such as, for example, a gradient strength, a gradient unit of the magnetic resonance apparatus and/or a number of recording channels, etc. Thus, a magnetic resonance protocol describes a defined and/or a specific way and manner of recording an image in accordance with a specific implementation of a magnetic resonance apparatus. For instance, and as further described herein, a contrast and/or a geometry and scan duration may be matched to the clinical and/or diagnostic issue underlying the upcoming magnetic resonance examination.

A scan sequence for a magnetic resonance examination may comprise a logical sequence of radio-frequency pulses (RF pulses), gradient pulses, and recording periods for controlling data recording for magnetic resonance data acquisition. As described herein, the scan sequence defines the basic magnetic resonance mechanisms used for magnetic resonance data acquisition, such as, for example, a gradient echo or spin echo, a steady state of magnetization, preparation pulses, etc. Typical and known scan sequences are, for example, a spin echo sequence (SE sequence), a turbo spin echo sequence (TSE sequence), echo planar imaging (EPI), etc. However, a scan sequence does not define the complete temporal expression of all RF pulses, gradient pulses, and recording periods, but only the interaction thereof. In principle, a parameterization of a sequence may be adapted, for example, by a user and/or a medical operator. Here, e.g. the timing of the sequence and/or the resolution of the scan sequence may be adapted to the clinical and/or medical issue.

Hence, a user is able to adapt individual scan parameters of the scan sequence to the medical and/or clinical issue underlying the magnetic resonance examination. Here, the user, e.g. a medical operator, may select a value for the at least one scan parameter, e.g. from a value space and/or from a value range for a value range scan parameter and/or select a state of a state scan parameter. A value range scan parameter e.g. comprises a permissible value range and/or a permissible value space within which a value for setting the value range scan parameter can be selected. For instance, a permissible value range and/or a permissible value space may comprise a continuous range, within which the value for setting the scan parameter may be selected.

A state scan parameter comprises at least two defined states that can be assumed by the state scan parameter. The state scan parameter may also comprise more than two defined states. A magnetic resonance sequence usually comprises a large number of scan parameters to be set. Here, the magnetic resonance sequence also comprises more than one state scan parameter. In the case of state scan parameters with setting options comprising at least two or more defined states, the difficulty is that often when a defined state of a state scan parameter is selected, a change to a further defined state the remaining scan parameters, e.g. the state scan parameters, are no longer compatible with the further defined state of the state scan parameters.

In the Equation 1 provided below, $N_S$ denotes a number of state scan parameters. The state scan parameter with the index $i_S$ comprises $N_V[i_S]$ possible states, wherein, $V[i_S, i_V[i_S]]$ represents the special and/or defined state with the index $i_V$ of the state scan parameter with the index $i_S$. Herein, $i_V[i_S] \in [0, N_V[i_S]-1]$. Hence, the total number and/or the overall number of possible combinations of settings and/or states of the individual state scan parameters is:

$$N_{CMax} = \Pi_{i_S=0}^{N_S-1} N_V[i_S] \qquad \text{Eqn. 1:}$$

Herein, a number $N_C$ of permissible combinations of settings and/or states of the individual state scan parameters is smaller than the total number of possible combinations $N_{CMax}$. To date, such a combination selection has made it difficult for the user to make a selection for finding a permissible combination, e.g. if the user has little experience in setting and/or selecting states of state scan parameters.

A user makes the selection of a state of the at least one state scan parameter at a user interface, e.g. at an input unit of the user interface. Herein, the user interface may be comprised by the computing unit and/or a magnetic resonance apparatus. In an embodiment, all available states of the at least one state scan parameter may be displayed to the user by means of the user interface, e.g. via an output unit of the user interface, for the selection of the state of the at least one state scan parameter.

The selection of the at least one state scan parameter with the settings and/or states of the further state scan parameters is checked (e.g. verified) by a computing unit as to whether the selection of the at least one state scan parameter with the settings and/or states of the further state scan parameters comprises a permissible combination of the selected states of the state scan parameters. In an embodiment, the computing unit checks the selection by means of comparison with a database.

A permissible combination of the selected settings and/or states of the state scan parameters is present if the scan sequence can be executed with the selected and/or set settings and/or states of the state scan parameters, and/or if the selected and/or set settings and/or states of the state scan parameters are not in contradiction with one another. On the other hand, an impermissible combination of selected settings and/or states of the state scan parameters to be set is present if the scan sequence cannot be executed, or can only be executed inadequately with the selected and/or set settings and/or states of the state scan parameters, and/or if the settings and/or states of the state scan parameters are in contradiction with one another. In an embodiment, the further scan parameters comprise at least one state scan parameter, e.g. a plurality of state scan parameters.

Herein, the computing unit may be implemented by and/or comprised as part of the magnetic resonance apparatus. In addition, it is also conceivable for the computing unit to be implemented separately from the magnetic resonance apparatus and the scan parameters, e.g. the state scan parameters, selected, and/or set by means of the computing unit to be transmitted to the magnetic resonance apparatus via a data transmission unit.

Likewise, at least one proposal comprising a permissible combination of settings and/or states of the state scan parameters to be set can be ascertained by the computing unit if the selection of the at least one state scan parameter with the settings and/or states of the further state scan parameters comprises an impermissible combination of settings and/or states. For the ascertaining of the at least one proposal comprising a permissible combination of the settings and/or states of the state scan parameters to be set, the computing unit may make use of a memory unit and/or a database. In an embodiment, the permissible combinations of settings and/or states of the state scan parameters to be set are stored in the memory unit and/or the database, thus enabling the at least one proposal to be ascertained quickly and/or easily.

The computing unit comprises at least one computing module and/or one processor, which may comprise processing circuitry, hardware, executable instructions, software, or combinations of these. The computing unit may be implemented to check the selection of the at least one state scan parameter and to ascertain a proposal. For example, the computing unit is may be implemented to execute computer-readable instructions to check the selection of the at least one state scan parameter and ascertain a proposal. In an embodiment, the computing unit comprises a memory unit, wherein computer-readable information is stored on the memory unit, wherein the computing unit is implemented to load the computer-readable information from the memory unit and execute the computer-readable information to check the selection of the at least one state scan parameter and ascertain a proposal. In addition, the computing unit may be implemented to execute the method(s) as discussed herein for providing a proposal for setting scan parameters comprising at least one value range scan parameter and at least two state scan parameters of a scan sequence of a magnetic resonance protocol for a magnetic resonance examination in that the computing unit controls and/or monitors the method step(s) of the selection of a state of the at least one state scan parameter and controls and/or monitors the method step(s) of the provision of the at least one proposal.

The components of the computing unit may be implemented in the form of software components. However, in principle these components may also to some extent, particularly where particularly fast calculations are involved, be implemented in the form of software-supported hardware components, for example FPGAs or the like. Likewise, for example if only a transfer of data from other software components is involved, the required interfaces may be implemented as software interfaces. However, the interfaces may also be implemented as hardware-based interfaces that are actuated by suitable software. It is of course also conceivable for several of the named components to be implemented together in the form of an individual software component or a software-supported hardware component.

The at least one proposal may be provided via the computing unit. Herein, the provision of the at least one proposal may comprise outputting the at least one proposal to the user. For example, the outputting of the at least one proposal to the user can comprise an optical output via an output unit of a user interface of the computing unit and/or the magnetic resonance apparatus.

The disclosure has the advantage that a user, e.g. a medical operator, is advantageously supported in setting the scan parameters, e.g. the state scan parameters. For instance, here the user does not need to know all the authorized combinations and/or unauthorized combinations of settings and/or states of the state scan parameters to be set, but is quickly and easily guided by the provision of the proposal to an authorized combination of settings and/or states in the state scan parameters to be set. In an embodiment, the at least one proposal comprises the best (e.g. optimum) possible proposal for a permissible combination of settings and/or states in the state scan parameters to be set for the upcoming magnetic resonance examination.

In previous systems, when selecting settings and/or states of the state scan parameters, the user was advised that, when selecting the settings and/or states of the state scan parameters, the selected setting and/or state leads to an impermissible and/or unauthorized combination of settings and/or states in the state scan parameters. Although in such a case the user does receive a proposal, the user has no influence on the settings of the further scan parameters. In addition, it may also be the case that a desired state of a state scan parameter cannot be set by the user at all if, with the further state scan parameters, this state leads to an impermissible and/or unauthorized combination of settings and/or states in the state scan parameters. The embodiments of the disclosure now enable a proposal for setting the scan parameters to be set to be made available easily and quickly as soon as an unauthorized and/or impermissible combination is present in the settings and/or values of the scan parameters to be set. For instance, in one step, for example by accepting the proposal, the user can obtain and/or set the best possible combination of settings and/or states in the state scan parameters to be set for the upcoming magnetic resonance examination. This also facilitates the operation of a scanner unit of a magnetic resonance apparatus and/or the setting of scan parameters to be set, e.g. for an inexperienced and/or untrained user.

If, for example when selecting the settings of a scan sequence, intended, and/or adapted for a 2D scan, the user has changed the state scan parameter "2D scan" to "3D scan", this has the result that a large number or almost all of the further state scan parameters have to be changed. However, this leads to complexity when setting the further state scan parameters that can overwhelm even experienced users. The disclosure quickly and easily provides the user with a proposal with a permissible and/or authorized combination of settings and/or states for setting the state scan parameters of the scan sequence for a 3D scan.

In one advantageous development of the method according to the disclosure, it can be provided that an application model is assigned to each permissible combination of the settings and/or values of state scan parameters, wherein the application model only comprises value range scan parameters. In an embodiment, the application model for the value range scan parameters changes in dependence on the settings and/or values of the state scan parameters. For instance, the assignment of an application model for the permissible combinations of the settings and/or values of the state scan parameters may be stored in a database. This can provide advantageous support for a user in the setting of scan parameters, e.g. state scan parameters and value range scan parameters.

In one advantageous development of the method according to the disclosure, it can be provided that, if a permissible combination of the settings and/or states of the state scan parameters to be set is present, a proposal for setting the value range scan parameters is provided. The presence of a permissible combination of the settings and/or states of the state scan parameters to be set can occur if, for example, the user has accepted a proposal with an authorized and/or permissible combination of the settings and/or states of the state scan parameters to be set.

In an embodiment, the proposal for setting the value range scan parameters is provided by means of the computing unit, e.g. automatically and/or autonomously, via the computing unit. For instance, the selection and/or setting of the value range scan parameters for the proposal may be implemented based on a dependency graph for the value range scan parameters, as is described in detail in DE 10 2016 222 785 A1 (US 20180143279 A1).

This embodiment of the disclosure enables an advantageous separation between state scan parameters and value range scan parameters when setting and/or selecting the scan parameters for a scan sequence of a magnetic resonance protocol for a magnetic resonance examination. Herein, it is also possible to achieve advantageous clarity for the user when setting the scan parameters, e.g. the state scan parameters and the value range scan parameters.

In one advantageous development of the method according to the disclosure, it can be provided that ascertaining of the at least one proposal comprises a list with a plurality of proposals with permissible combinations of settings and/or states of the state scan parameters to be set. The list with the plurality of proposals with permissible combinations of settings and/or states of the state scan parameters to be set may comprise two or more proposals with permissible combinations of settings and/or states of the state scan parameters to be set. In an embodiment, each proposal comprises a permissible and/or authorized combination of settings and/or states of the state scan parameters to be set. Such an embodiment of the disclosure has the advantage that the user, e.g. the medical operator, can choose from a large number of proposals for the settings and/or states of the state scan parameters to be set.

In one advantageous development of the method according to the disclosure, it can be provided that the list with permissible combinations of settings and/or states of the state scan parameters to be set is sorted in dependence on the number of settings and/or states of the state scan parameters to be changed. The number of scan parameters to be changed, e.g. the state scan parameters to be changed, may comprise the number of state scan parameters to be changed with respect to the selection of the settings and/or states of the state scan parameters made by the user to achieve an authorized and/or permissible combination of settings and/or states of the state scan parameters to be set. For instance, in such a case the list is sorted such that the proposals with the authorized and/or permissible combinations of settings and/or states of the state scan parameters to be set with the fewest number of changes are shown at the start of the list, and the number of changes in the proposals increases going down the list.

This embodiment of the disclosure enables the user, e.g. a medical operator, to be initially shown the proposals with the fewest changes with respect to the selection made by the user. Thus, the proposals shown and/or depicted first in the list are those with the most matches with the selection of settings of the scan parameters, e.g. the state scan parameters, made by the user. The depiction of the proposals in a sorted list enables the user to detect quickly the extent by which the individual proposals deviate from the user-selected settings of the state scan parameters. Consequently, the user can also reach a quick decision as to which of the proposals for permissible combinations best matches the user's desired scan strategy and hence can be selected.

In one advantageous development of the method according to the disclosure, it can be provided that a permissible combination of settings and/or states of the state scan parameters to be set is selected from the list of permissible combinations. In an embodiment, a permissible combination of settings and/or states of the state scan parameters to be set is selected from the list of proposals with the permissible combinations by a user. Alternatively or additionally, the selection can also be made in an automated manner by the computing unit, which can have a special selection algorithm for this purpose.

Thus, a user, e.g. the medical operator, may personally decide which settings in the scan parameters, e.g. in the state scan parameters, are preferred and/or should be set for the upcoming magnetic resonance examination. The selection of a permissible combination from the list of permissible combinations enables the individual scan parameters to be set, e.g. the state scan parameters, to be set in accordance with the proposal. Herein, the setting and/or selection of the settings and/or states of the state scan parameters may be implemented automatically by means of the computing unit. In addition, it can also be provided that the setting and/or the selection of the settings and/or states of the state scan parameters are performed by the user. If the user personally sets the scan parameters to be set, e.g. the state scan parameters to be set, it can be provided that, when setting the scan parameters, the user is supported by the computing unit such that the user is shown an admissible value, e.g. an admissible state, for each scan parameter to be set, e.g. the state scan parameters to be set.

In one advantageous development of the method according to the disclosure, it can be provided that the provision of the at least one proposal comprises the display of a change of state for all state scan parameters to be changed, wherein the change of state leads to a permissible combination of settings and/or states of the state scan parameters to be set. The change of state may comprise all changes to the selected and/or set states for all state scan parameters to be changed, which are to be changed based on the selection of the state of the at least one state scan parameter made by the user to obtain a permissible combination of settings and/or states of the state scan parameters to be set. In an embodiment, the depiction and/or display of the change of state for all state scan parameters to be changed may be implemented via a display unit and/or depiction unit of the user interface. The change of state may lead to a permissible and/or authorized combination of settings and/or states of the state scan parameters to be set. The display of the change of state enables the user to detect quickly the extent by which the proposal or the change of state deviates from the user-selected setting. Consequently, the user can also reach a quick decision as to which of the proposals best matches the user's desired scan strategy and hence can be selected.

In one advantageous development of the method according to the disclosure, it can be provided that all permissible combinations of settings of the at least two state scan parameters are stored in a database for each state of the at least two state scan parameters. This enables the user to be provided with a simple and in quick selection of the individual state scan parameters for a proposal for a permissible combination of settings and/or states of the at least two state scan parameters. Herein, the database can be comprised by the computing unit. In addition, the database can also be implemented separately from the computing unit, wherein here the computing unit may access the database via a data transmission unit.

In one advantageous development of the method according to the disclosure, it can be provided that the permissible combinations of settings and/or states of the at least two state scan parameters are stored in a matrix. Herein, the matrix may be comprised by the database. In such a case, a matrix represents the simplest way in which all permissible and/or authorized combinations of settings and/or states of the individual state scan parameters can be detected and retrieved to check and/or ascertain a proposal. The matrix may comprise Z rows and S columns. In this case, a permissible and/or authorized combination of settings and/or states of the state scan parameters is stored in each row of the Z rows, wherein the individual rows of the matrix are unique.

Each column of the S columns of the matrix may comprise exactly one state scan parameter. Hence, the number S of columns corresponds to the number of state scan parameters. In addition, each state scan parameter has a neutral state. This neutral state is assigned the value "0". This ensures that, when a new state scan parameter is added to an existing set and/or number of state scan parameters, e.g. when a new column is added to the matrix, the overall state of the permissible and/or authorized combinations is not changed provided that the new state scan parameter assumes the value "0". Hence, a new column is added to the matrix for each new state. If a new state scan parameter has already been implemented for some and/or selected scan sequences and/or scan protocols, the new state scan parameter may comprise a value different from zero in the matrix for these embodiments. In addition, this embodiment has the advantage that a new state scan parameter may be implemented and/or added easily when selecting the scan parameters for a scan protocol. In addition, during the selection of the scan parameters, the new state scan parameter may only be enabled for those options, e.g. scan options and/or scan sequences for which the new state scan parameter is already implemented in the sequence. Here, the enabling of the state scan parameter comprises a value deviating from "zero" and/or a value different from "zero" in the corresponding row of the matrix.

In addition, it can also be the case that each row of the matrix comprises exactly one state scan parameter, and each column of the matrix comprises a permissible combination of the settings of the at least two state scan parameters.

Furthermore, the disclosure is based on a computing unit implemented to execute the methods as described herein for providing a proposal for setting scan parameters comprising at least one value range scan parameter and at least two state scan parameters of a scan sequence of a magnetic resonance protocol for a magnetic resonance examination, wherein the computing unit has a setting algorithm and accesses a database in which all permissible combinations of settings and/or states of the at least two state scan parameters are held and/or stored. Herein, the computing unit may have a memory unit that comprises the database. In addition, it can also be the case that the memory unit and/or the database is implemented separately from the computing unit. Here, the memory unit and/or database can also be implemented in the cloud. Furthermore, it can also be the case that the computing unit is comprised by the magnetic resonance apparatus with which the upcoming magnetic resonance examination is to be executed. Alternatively, the computing unit may also be implemented separately from the magnetic resonance apparatus.

The computing unit according to the disclosure has the advantage that a user, e.g. a medical operator, is advantageously supported in setting the scan parameters, e.g. the state scan parameters. In such a case, the user does not need to know all authorized combinations and/or unauthorized combinations of settings and/or states of the state scan parameters to be set, but is guided quickly and easily by the provision of the proposal to an authorized combination of settings and/or states in the state scan parameters to be set. A further advantage is that a proposal for setting the state scan parameters to be set can be made available to a user easily and quickly as soon as an unauthorized and/or impermissible combination is present in the settings and/or states of the state scan parameters to be set. This also facilitates the operation of a scanner unit of a magnetic resonance apparatus and/or the setting of state scan parameters to be set, e.g. for inexperienced and/or untrained users.

The advantages of the computing unit according to the disclosure substantially correspond to the advantages of the method according to the disclosure for providing a proposal for setting scan parameters, which are explained above in detail. Features, advantages, or alternative embodiments mentioned herein can likewise also be transferred to the other claimed subject matter, and vice versa.

Furthermore, the disclosure is based on a magnetic resonance apparatus with a scanner unit and a computing unit, wherein the computing unit is implemented to execute a method for providing a proposal for setting scan parameters comprising at least one value range scan parameter and at least two state scan parameters of a scan sequence of a magnetic resonance protocol for a magnetic resonance examination, wherein the computing unit has a setting algorithm and accesses a database in which all permissible combinations of settings and/or states of the at least two state scan parameters are held and/or stored.

The magnetic resonance apparatus according to the disclosure has the advantage that a user, e.g. a medical operator, is advantageously supported in setting the scan parameters, e.g. the state scan parameters. In an embodiment, the user does not need to know all the authorized combinations and/or unauthorized combinations of settings and/or states of the state scan parameters to be set but is quickly and easily guided by the provision of the proposal to an authorized combination of settings and/or states in the state scan parameters to be set. A further advantage is that a proposal for setting the state scan parameters to be set may be made available to a user easily and quickly as soon as an unauthorized and/or impermissible combination is present in the settings and/or states of the state scan parameters to be set. This also facilitates the operation of a scanner unit of a magnetic resonance apparatus and/or the setting of state scan parameters to be set, in particular for inexperienced and/or untrained users.

The advantages of the magnetic resonance apparatus according to the disclosure substantially correspond to the advantages of the method according to the disclosure for providing a proposal for setting scan parameters, which are described herein in detail. Features, advantages, or alternative embodiments can likewise also be transferred to the other claimed subject matter, and vice versa.

Furthermore, the disclosure is based on a computer program product (e.g. a non-transitory computer-readable medium), which comprises a program and may be loaded directly into a memory of a programmable computing unit, with a suitable program for executing a method for providing a proposal for setting scan parameters comprising at least one value range scan parameter and at least two state scan parameters of a scan sequence of a magnetic resonance protocol for a magnetic resonance examination when the program is executed in the computing unit. Herein, the computer program may implement any suitable type of program means, for example, libraries and auxiliary functions, to implement the corresponding embodiments of the method. Herein, the computer program may comprise software with a source code that may be compiled and linked, or only has to be interpreted or an executable software code that is then loaded into a corresponding computing unit for execution.

The computer program product according to the disclosure may be loaded directly into a memory of a programmable computing unit and has program code means for executing a method according to the disclosure for providing a proposal for setting scan parameters comprising at least one value range scan parameter and at least two state scan parameters of a scan sequence of a magnetic resonance protocol for a magnetic resonance examination when the computer program product is executed in the computing unit. The computer program product may be a computer program or comprise a computer program. This enables the method according to the disclosure to be executed quickly, identically, repeatedly, and robustly. The computer program product is configured to execute the method steps according to the disclosure of the method for providing a proposal for setting scan parameters comprising at least one value range scan parameter and at least two state scan parameters of a scan sequence of a magnetic resonance protocol for a magnetic resonance examination by means of the computing unit. Herein, the computing unit may in each case fulfill the requisite conditions such as, for example, having an appropriate random access memory, an appropriate graphics card or an appropriate logical unit, etc., such that the respective method steps can be executed efficiently. The computer program product may, for example, be stored on a computer-readable medium or held on a network or server from where the computer program product may be loaded into the processor of a local computing unit, which is directly connected to the magnetic resonance apparatus or implemented as a part thereof. Furthermore, control information of the computer program product may be stored on an electronically readable data carrier. The control information of the electronically readable data carrier may be implemented to execute a method according to the disclosure when the data carrier is used in a computing unit. For example, the computer program product may also represent an electronically readable data carrier. Examples of electronically readable data carriers are a DVD, a magnetic tape, a hard disk or a USB stick on which electronically readable control information, in particular software (see above) is stored. When this control information (software) is read from the data carrier and stored in a control unit and/or a computing unit, all the embodiments according to the disclosure of the above-described method can be carried out. Thus, the disclosure can also be based on said computer-readable medium and/or said electronically readable data carrier.

BRIEF DESCRIPTION OF THE DRAWINGS/FIGURES

Further advantages, features and details of the disclosure will emerge from the exemplary embodiment described in the following and with reference to the drawings.

In the drawings:

FIG. 1 illustrates an example schematic depiction of a magnetic resonance apparatus according to one or more embodiments of the present disclosure; and FIG. 2 illustrates a method to one or more embodiments of the present disclosure for providing a proposal for setting scan parameters comprising at least one value range scan parameter and at least two state scan parameters of a scan sequence of a magnetic resonance protocol for a magnetic resonance examination.

DETAILED DESCRIPTION

FIG. 1 is a schematic depiction of an example magnetic resonance apparatus 10. The magnetic resonance apparatus 10 comprises a scanner unit 11 (e.g. a scanner) formed by a magnet unit (e.g. a magnet and/or associated drivers and hardware components). In addition, the magnetic resonance apparatus 10 has a patient receiving region 12 for receiving a patient 13. In the present exemplary embodiment, the patient receiving region 12 is implemented as cylindrical and is surrounded cylindrically in a circumferential direction by the scanner unit 11, e.g. by the magnet unit. In principle, however, an embodiment of the patient receiving region 12 deviating therefrom is readily conceivable. The patient 13 can be pushed and/or moved into the patient receiving region 12 by means of a patient positioning apparatus 14 of the magnetic resonance apparatus 10. For this purpose, the patient positioning apparatus 14 has a patient table 15 which is configured to be movable within the patient receiving region 12. For instance, the patient table 15 may be positioned movably in the direction of a longitudinal extension of the patient receiving region 12 and/or in the z direction.

The scanner unit 11, e.g. the magnet unit, comprises a superconducting main magnet 16 for generating a strong and in particular constant main magnetic field 17. The scanner unit 11, e.g. the magnet unit, further has a gradient coil unit 18 (e.g. gradient generation circuitry, which may include one or more processors, processing circuitry, hardware, software, executable instructions, or combinations of these) for generating magnetic field gradients that are used for position encoding during imaging. The gradient coil unit 18 may be controlled via a gradient control unit 19 (e.g. a computing device, controller, and/or control circuitry, which may include one or more processors, processing circuitry, hardware, software, executable instructions, or combinations of these) of the magnetic resonance apparatus 10. The scanner unit 11, e.g. the magnet unit, further comprises a radio-frequency antenna unit 20 (e.g. RF generation circuitry, which may include one or more processors, processing circuitry, hardware, software, executable instructions, or combinations of these) for exciting polarization that is established in the main magnetic field 17 generated by the main magnet 16. The radio-frequency antenna unit 20 is controlled by a radio-frequency antenna control unit 21 (e.g. a computing device, controller, and/or control circuitry, which may include one or more processors, processing circuitry, hardware, software, executable instructions, or combinations of these) of the magnetic resonance apparatus 10 and radiates radio-frequency magnetic resonance sequences into the patient receiving region 12 of the magnetic resonance apparatus 10.

To control the main magnet 16, the gradient control unit 19, the radio-frequency antenna control unit 21, the magnetic resonance apparatus 10 has a system control unit 22 (e.g. a computing device, controller, and/or control circuitry, which may include one or more processors, processing circuitry, hardware, software, executable instructions, or combinations of these). The system control unit 22 centrally controls the magnetic resonance apparatus, such as, for example, for the performance of a predetermined imaging gradient echo sequence. In addition, the system control unit 22 comprises an evaluation unit (not depicted in further detail, but which may comprise (e.g. evaluation circuitry, which may include one or more processors, processing circuitry, hardware, software, executable instructions, or combinations of these) for evaluating medical image data which is acquired during the magnetic resonance examination.

Furthermore, the magnetic resonance apparatus 10 comprises a user interface 23, which is connected to the system control unit 22. Control information such as, for example, imaging parameters and reconstructed magnetic resonance images may be displayed on an output unit 24, for example on at least one monitor, of the user interface 23 for a medical operator. The user interface 23 further has an input unit 25 (e.g. a mouse, touch screen device, keyboard, etc.) by means of which information and/or parameters may be input by the medical operator during a scanning procedure.

The magnetic resonance apparatus 10 depicted can obviously comprise further or alternate components typical of magnetic resonance apparatuses 10. In addition, the general mode of operation of a magnetic resonance apparatus 10 is known to the person skilled in the art so that no detailed description of the further components will be given for purposes of brevity.

FIG. 2 depicts a method according to the disclosure for providing a proposal for setting scan parameters comprising at least one value range scan parameter and at least two state scan parameters of a scan sequence of a magnetic resonance protocol for a magnetic resonance examination, wherein the magnetic resonance examination is performed by means of the magnetic resonance apparatus. The method for providing a proposal for setting scan parameters may be executed and/or controlled by means of a computing unit 26 as shown in FIG. 1 (e.g. a computing device, controller, and/or control circuitry, which may include one or more processors, processing circuitry, hardware, software, executable instructions, or combinations of these). In the present exemplary embodiment, the computing unit 26 is comprised by the magnetic resonance apparatus 10. Herein, in the present exemplary embodiment, the computing unit 26 is implemented as separate from the system control unit 22, but is connected to the system control unit 22 for data exchange. In an alternative embodiment of the disclosure, the computing unit 26 may be integrated in the system control unit 22 and/or comprised by the system control unit 22. In addition, in an alternative embodiment of the disclosure, the computing unit 26 may also be implemented separately from the magnetic resonance apparatus 10.

To execute the method for providing a proposal for setting scan parameters and/or for controlling the method for providing a proposal for setting scan parameters, the computing unit 26 has appropriate software and/or computer programs. The software and/or computer programs are stored in a memory unit 27 (e.g. any suitable type and/or size of memory such as random-access memory, read-only memory, memory controllers, etc.), wherein the memory unit 27 is comprised by the computing unit 26. In an alternative embodiment of the computing unit 26, the software and/or computer programs may also be stored in a memory unit implemented separately from the computing unit 26. The software and/or computer programs is/are specially implemented to execute and/or control the method according to the disclosure for providing a proposal for setting scan parameters comprising at least one value range scan parameter and at least two state scan parameters of a scan sequence of a magnetic resonance protocol for a magnetic resonance examination. In an embodiment, the software and/or computer programs comprises/comprise a special setting algorithm for providing a proposal for setting scan parameters of a scan sequence. To execute the method according to the disclosure for providing a proposal for setting scan parameters comprising at least one value range scan parameter and at least two state scan parameters of a scan sequence of a magnetic resonance protocol for a magnetic resonance examination, the software and/or the computer programs is/are executed by a processor and/or a computing module of the computing unit 26.

The method according to the disclosure for providing a proposal for setting scan parameters comprising at least one value range scan parameter and at least two state scan parameters of a scan sequence of a magnetic resonance protocol for a magnetic resonance examination supports a user in the setting of scan parameters for an upcoming magnetic resonance examination. Before a magnetic resonance examination on a patient 13, e.g. on an area of the patient to be examined 13, it is necessary for the magnetic resonance examination, e.g. the individual scan sequences and/or magnetic resonance protocols, to be adapted to the patient 13 and/or to the clinical issue underlying the magnetic resonance examination. Herein the user, e.g. the medical operator, has the option of adapting and/or setting individual scan parameters.

During the input and/or setting of the individual scan parameters, in a first method step 100 controlled by the computing unit 26, the user selects a state of at least one state scan parameter. The user can make the input on an input unit 25. In the present exemplary embodiment, the input unit 25 is comprised by the user interface 23 of the magnetic resonance apparatus 10. In addition, the input unit 25 can also be comprised by a user interface of the computing unit 26. In an embodiment, the user uses the input unit 25 to select all scan parameters to be set, e.g. all state scan parameters and all value range scan parameters.

Since the individual state scan parameters are also at least partially dependent upon one another so that an arbitrary combination is not possible in the settings and/or states for the scan parameters to be set, e.g. the state scan parameters to be set, in a second method step 101 the selection of the at least one state scan parameter with the settings and/or the states of the further state scan parameters is checked (e.g. verified) by means of the computing unit 26. Here, the computing unit 26 checks whether the selection of the at least one state scan parameter with the settings and/or states of the further state scan parameters comprises a permissible combination of the selected settings and/or values of the state scan parameters to be set. A permissible combination of the selected settings and/or states of the state scan parameters is present if the scan sequence can be executed with the selected and/or set settings and/or states of the state scan parameters and/or if the selected and/or set settings and/or states of the state scan parameters are not in contradiction with one another. On the other hand, an impermissible combination of selected settings and/or states of the state scan parameters to be set is present if the scan sequence cannot be executed or can only be executed inadequately with the selected and/or set settings and/or states of the state scan parameters and/or if the settings and/or states of the state scan parameters are in contradiction with one another.

Again, in the case of state scan parameters with setting options comprising at least two or more defined states, the difficulty is often that when a defined state of a state scan parameter is selected, a change to a further defined state the remaining scan parameters, in particular the state scan parameters, are no longer compatible with the further defined state of the state scan parameters. For easier checking by the computing unit 26, all permissible combinations of settings of the state scan parameters are stored in a database. For instance, the permissible combinations of settings of state scan parameters are stored in the database for all scan sequences and/or all scan protocols. In the present exemplary embodiment, the database is stored in the memory unit 27 of the computing unit 26. In addition, the database may also be implemented separately from the computing unit 26 and/or the magnetic resonance apparatus 10.

In an embodiment, the permissible combinations of settings of the plurality of state scan parameters, e.g. all the state scan parameters, are stored in a matrix. The matrix is held and/or stored in the database.

Here, the matrix represents the simplest way in which all permissible and/or authorized combinations of settings of the individual state scan parameters can be ascertained and retrieved. The matrix preferably comprises Z rows and S columns. Here, a permissible and/or authorized combination of settings of the state scan parameters is stored in each row of the Z rows of the matrix, wherein the individual rows of the matrix are unique. In addition, each column of the S columns of the matrix may comprise exactly one state scan parameter. In addition, each state scan parameter has a neutral state. This neutral state is assigned the value "0". This ensures that, when a new state scan parameter is added to an existing set and/or number of state parameters, e.g. when adding a new column to the matrix, the overall state of the permissible and/or authorized combinations is not changed provided that the new state scan parameter assumes the value "0". Hence, a new column is added to the matrix for each new state. If a new state scan parameter has already been implemented for some and/or selected scan sequences and/or scan protocols, the new state scan parameter may comprise a value different from zero in the matrix for these embodiments. Herein, it can also be provided that suitable methods are used when defining and/or creating the matrix so that it is not necessary for each row of the matrix to be specified explicitly. For example, here, a suitable method can be the use of "wildcards."

In a further, e.g. third, method step 102, in the event of the selection of the at least one state scan parameter being incompatible with the settings and/or states of the further state scan parameters and/or comprising an impermissible combination of the selected settings and/or states of the state scan parameters, at least one proposal comprising a permissible combination of the settings and/or states of the state scan parameters to be set is ascertained. The ascertaining of the at least one proposal comprising a permissible combination of the settings and/or states of the state scan parameters to be set is performed by the computing unit 26. Herein, the at least one proposal can be ascertained based on the database, in particular based on the matrix.

In this third method step 102, the ascertaining of the at least one proposal may also comprise ascertaining a plurality of proposals with permissible combinations of settings and/or states of the state scan parameters to be set, wherein the plurality of proposals are held in a list. Here, the list with the plurality of proposals of permissible combinations of settings and/or states of the state scan parameters to be set is preferably sorted by the computing unit 26 in dependence on the number of state scan parameters to be changed. Thus, the proposal with the fewest changes to settings and/or states of the state scan parameters to be set selected by the user is in first place in the list with the plurality of proposals.

Herein, the ascertaining of the at least one proposal and/or the list of proposals of permissible combinations of settings and/or states of the state scan parameters to be set also comprises that a change of state for all state scan parameters to be changed is ascertained by means of the computing unit 26. Herein, the change of state ascertained leads to a permissible combination of settings and/or states of the state scan parameters to be set.

In a further fourth method step 103, the at least one proposal and/or the list with the plurality of proposals is provided. The at least one proposal and/or the list with the plurality of proposals may be provided via the computing unit 26 and/or controlled via the computing unit 26. In addition, the provision of the at least one proposal and/or the list with the plurality of proposals comprises the outputting of the at least one proposal and/or the list with the plurality of proposals by means of the output unit 24. In the present exemplary embodiment, the output unit 24 is comprised by the user interface 23 of the magnetic resonance apparatus 10. In addition, it can also be the case that the output unit 24 for outputting the at least one proposal and/or the list with the plurality of proposals is comprised by the computing unit 26.

Herein, the provision of the at least one proposal and/or the list with the plurality of proposals also comprises that a change of state for all state scan parameters to be changed is displayed to the user, wherein the displayed change of state leads to a permissible combination of settings and/or states of the state scan parameters to be set. Hence, it is possible for the user to be shown a simple and clear depiction of the proposals from the list comprising, for example, the fewest changes with respect to the settings and/or states selected by the user.

In a further fifth method step 104, one of the proposals with a permissible combination of settings and/or states of the state scan parameters to be set is selected from the list of the plurality of proposals for the permissible combinations. Herein, in this fifth method step 104, the selection can be made by the user, wherein, for this purpose, the user selects a proposal from the list of the plurality of proposals for permissible combinations by means of the input unit 25.

In addition, it can also be the case that the user leaves the selection of a proposal from the list of the plurality of proposals for permissible combinations to the computing unit 26. In such a case, the computing unit 26 then automatically selects the proposal from the list of the plurality of proposals for permissible combinations which has the fewest deviations from the selection made by the user and/or which best matches the clinical issue underlying the upcoming magnetic resonance examination.

After accepting a proposal from the list of the plurality of proposals for permissible combinations, as a result of which a permissible combination of the settings and/or states of the state scan parameters to be set is present, in a further sixth method step 105, a proposal for setting the value range scan parameters is provided. Here, an application model is assigned to each permissible combination of the settings and/or values of state scan parameters, wherein the application model only comprises value range scan parameters. The assignment between the application model and the permissible combinations of settings and/or values of the state scan parameters is preferably likewise stored in the database. Herein, the selection and/or setting of the value range scan parameters for the proposal can be made based on a dependency graph for the value range scan parameters, as described in detail in DE 10 2016 222 785 A1 (US 20180143279 A1). A dependency graph may be ascertained via the computing unit 26. The proposal for setting the value range scan parameters, e.g. the ascertaining of the dependency graph, may be provided automatically and/or autonomously via the computing unit 26.

Although the disclosure has been illustrated and described in greater detail by the preferred exemplary embodiment, the disclosure is not restricted by the disclosed examples and other variations can be derived therefrom by the person skilled in the art without departing from the scope of protection of the disclosure.

What is claimed is:

1. A method for providing a proposal for setting scan parameters, comprising:

verifying, via one or more processors, whether a parameter combination of (i) a selection of a state of at least one state scan parameter from among scan parameters, the at least one state scan parameter corresponding to a plurality of states, and the state of the at least one state scan parameter corresponding to a selection of one of the plurality of states with respect to a magnetic resonance examination, and (ii) settings and/or states of additional state scan parameters from among the scan parameters comprises a permissible combination of selected settings and/or states of the state scan parameters to be set, wherein the scan parameters include at least one value range scan parameter and at least two state scan parameters of a scan sequence of a magnetic resonance protocol to be used for the magnetic resonance examination;

assigning an application model to each one of a permissible combination of selected settings and/or states of the state scan parameters to be set, the application model only comprising value range scan parameters;

when the parameter combination comprises an impermissible combination of the selected settings and/or states of the scan parameters to be set, identifying, via one or more processors, at least one proposal comprising a permissible parameter combination including (i) the selected at least one state scan parameter, and (ii)

settings and/or states of additional state scan parameters from among the scan parameters; and presenting, via a display, the at least one proposal comprising the permissible parameter combination.

2. The method as claimed in claim 1, wherein, when the parameter combination comprises a permissible parameter combination, presenting, via the display, the at least one proposal comprising value range scan parameters corresponding to settings identified with the permissible combination.

3. The method as claimed in claim 1, wherein the act of identifying the at least one proposal comprises identifying a list with a plurality of proposals and associated permissible combinations of selected settings and/or states of state scan parameters.

4. The method as claimed in claim 3, further comprising:
sorting, via one or more processors, the list of permissible combinations based upon a number of settings and/or states of scan parameters to be changed.

5. The method as claimed in claim 3, wherein the permissible combination of settings and/or states of scan parameters to be set is selected from a list of stored permissible combinations.

6. The method as claimed in claim 1, wherein the act of presenting the at least one proposal comprising the permissible parameter combination comprises presenting a change of state for each one of the scan parameters to be changed, and
wherein the change of state of the scan parameters results in a permissible combination of settings and/or states of scan parameters to be set.

7. The method as claimed in claim 1, wherein each one of a set of permissible parameter combinations that include settings of the at least two state scan parameters are stored in a database for each respective state of the at least two state scan parameters.

8. The method as claimed in claim 1, wherein the permissible combinations of settings and/or states of the at least two state scan parameters are stored as a matrix.

9. The method as claimed in claim 8, wherein each row of the matrix comprises a permissible combination of the settings of the at least two state scan parameters.

10. The method as claimed in claim 8, wherein each column of the matrix comprises one state scan parameter.

11. The method as claimed in claim 10, wherein each of the at least two state scan parameters comprises a respective neutral state value in which a respective state scan parameter may assume within the matrix.

12. The method as claimed in claim 1, wherein the application model changes in dependence on the settings and/or values of the state scan parameters.

13. The method as claimed in claim 12, wherein an assignment between the application model and the permissible combinations of settings and/or values of the state scan parameters is stored in a database.

14. The method as claimed in claim 1, wherein the plurality of states identified with the at least one state scan parameter define types of scan sequences of magnetic resonance protocols to be used for the magnetic resonance examination.

15. The method as claimed in claim 14, wherein the types of scan sequences comprise two-dimensional (2D) and three-dimensional (3D) scan sequences.

16. A magnetic resonance apparatus, comprising:
a scanner; and
control circuitry configured to control the magnetic resonance apparatus to provide a proposal for setting scan parameters used by the scanner by:
verifying whether a parameter combination of (i) a selection of a state of at least one state scan parameter from among scan parameters, the at least one state scan parameter corresponding to a plurality of states, and the state of the at least one state scan parameter corresponding to a selection of one of the plurality of states with respect to a magnetic resonance examination, and (ii) settings and/or states of additional state scan parameters from among the scan parameters comprises a permissible combination of selected settings and/or states of the state scan parameters to be set,
wherein the scan parameters include at least one value range scan parameter and at least two state scan parameters of a scan sequence of a magnetic resonance protocol to be used for the magnetic resonance examination;
assigning an application model to each one of a permissible combination of selected settings and/or states of the state scan parameters to be set, the application model only comprising value range scan parameters;
when the parameter combination comprises an impermissible combination of the selected settings and/or states of the scan parameters to be set, identifying at least one proposal comprising a permissible parameter combination including (i) the selected at least one state scan parameter, and (ii) settings and/or states of additional state scan parameters from among the scan parameters; and
causing a display to present the at least one proposal comprising the permissible parameter combination.

17. A non-transitory computer-readable medium having instructions stored thereon that, when executed by control circuitry of a magnetic resonance apparatus, cause the magnetic resonance apparatus to provide a proposal for setting scan parameters by:
verifying whether a parameter combination of (i) a selection of a state of at least one state scan parameter from among scan parameters, the at least one state scan parameter corresponding to a plurality of states, and the state of the at least one state scan parameter corresponding to a selection of one of the plurality of states with respect to a magnetic resonance examination, and (ii) settings and/or states of additional state scan parameters from among the scan parameters comprises a permissible combination of selected settings and/or states of the state scan parameters to be set,
wherein the scan parameters include at least one value range scan parameter and at least two state scan parameters of a scan sequence of a magnetic resonance protocol to be used for the magnetic resonance examination;
assigning an application model to each one of a permissible combination of selected settings and/or states of the state scan parameters to be set, the application model only comprising value range scan parameters;
when the parameter combination comprises an impermissible combination of the selected settings and/or states of the scan parameters to be set, identifying at least one proposal comprising a permissible parameter combination including (i) the selected at least one state scan parameter, and (ii) settings and/or states of additional state scan parameters from among the scan parameters; and causing a display to present the at least one proposal comprising the permissible parameter combination.

* * * * *